United States Patent [19]
Kim

[11] Patent Number: 5,776,805
[45] Date of Patent: Jul. 7, 1998

[54] METHOD FOR MANUFACTURING MESFET

[75] Inventor: Chang Tae Kim, Seoul, Rep. of Korea

[73] Assignee: LG Semicon Co., Ltd., Chungcheongbuk-Do, Rep. of Korea

[21] Appl. No.: 772,834

[22] Filed: Dec. 24, 1996

[30] Foreign Application Priority Data

Dec. 29, 1995 [KR] Rep. of Korea .............. 1995-67257

[51] Int. Cl.$^6$ .............. H01L 21/338; H01L 21/28
[52] U.S. Cl. .............. 438/182; 438/180; 438/579
[58] Field of Search .............. 438/579, 578, 438/577, 576, 574, 573, 575, 580, 581, 582, 670, 336, 337, 338, 339, 182, 180; 148/DIG. 140

[56] References Cited

U.S. PATENT DOCUMENTS

| | | | |
|---|---|---|---|
| 4,040,168 | 8/1977 | Huang | 438/576 |
| 4,367,119 | 1/1983 | Logan et al. | 438/951 |
| 4,519,872 | 5/1985 | Anderson, Jr. et al. | 438/670 |
| 4,670,090 | 6/1987 | Sheng et al. | 438/182 |
| 4,692,205 | 9/1987 | Sachdev et al. | 438/670 |
| 5,032,541 | 7/1991 | Sakamoto et al. | 438/574 |

*Primary Examiner*—Michael Trinh
*Attorney, Agent, or Firm*—John P. White; Cooper & Dunham LLp

[57] ABSTRACT

Method for manufacturing a metal semiconductor field-effect transistor (MESFET) in which a gate area contacting a semiconductor surface is diminished and a gate cross area is increased, to improve frequency characteristics of a device is disclosed, including the steps of: forming an n-type GaAs layer and a heavily doped n$^+$-type GaAs layer on a substrate, sequentially; forming a first insulating layer on the heavily doped n$^+$-type GaAs layer; forming a first photoresist layer having a first aperture on the first insulating layer; removing the first insulating layer of the first aperture so that the first insulating layer below both ends of the first photoresist layer is under-cut; forming a second insulating layer on the substrate in the first apertures to form a second apertures at each of under-cut portions and simultaneously removing the first photoresist layer; forming a third aperture in each of the second apertures and forming a second photoresist layer on the first and second insulating layers; removing the heavily doped n$^+$-type GaAs layer in each of the second apertures to expose the n-type GaAs layer; and forming a gate electrode in the second and third apertures to contact the n-type GaAs layer and simultaneously removing the second photoresist layer.

12 Claims, 8 Drawing Sheets

//<br>
METHOD FOR MANUFACTURING MESFET

BACKGROUND OF THE INVENTION

1. Field of the Invention

The present invention relates to a method for manufacturing a semiconductor device and, more particularly, to a method for manufacturing a metal semiconductor field-effect transistor (MESFET) in which a gate area contacting a semiconductor surface is reduced and a gate cross sectional area is increased, to improve frequency characteristics of the device.

2. Discussion of the Related Art

A gallium arsenide (GaAs) MESFET, which is known as the origin of a compound semiconductor device, is a field-effect transistor for varying electron flow, which is flowing in GaAs which is a material for high electron mobility, by control of a width of a depletion layer under a schottky junction gate.

A MESFET has been developed as an amplifier device having high speed digital, low noise of micro wave, or high output power. In order to improve device frequency characteristics in a gallium arsenide (GaAs) MESFET, it is most effective to reduce a gate length. However, the decrease of the gate length causes the increase of gate serial resistance. As a result, the device frequency characteristics are degraded.

A method for forming a T-type gate has been suggested in which an area contacting the surface of a semiconductor substrate is reduced and a cross area of the gate is large.

A conventional method for manufacturing a MESFET will be explained with reference to the attached drawings.

FIGS. 1a to 1d are cross-sectional views of a manufacturing process of a MESFET.

Referring to FIG. 1a, an n-type GaAs layer 1 and a heavily doped n-type GaAs layer 2 are sequentially, epitaxially grown on a substrate (not shown). Subsequently, first and second photoresist layers 3 and 4 are sequentially formed on the N$^+$-type GaAs layer 2. Referring to FIG. 1b, the first and second photoresist layers 3 and 4 are subjected to exposure and development of an electron beam, thus having holes of different widths, respectively. In this case, since each of the first and second photoresist layers 3 and 4 has a different thickness, they have different sensitivities with regard to exposure of an electron beam. And the second photoresist layer 4 has a higher sensitivity than the first photoresist layer 3.

Referring to FIG. 1c, with the first photoresist layer 3 serving as a mask, the n$^+$-type GaAs layer 2 is wet-etched to form a trench. Then, a gate metal layer 5 is formed on the entire surface.

Referring to FIG. 1d, the remaining first and second photoresist layers 3 and 4 are removed. When removing the first and second photoresist layers 3 and 4, the gate metal formed on the second photoresist layer 4 is removed by employing a lift-off process, so that a T-type gate electrode 5 a is formed to contact the n-type GaAs layer 1.

Such a conventional method for manufacturing a MESFET has the following problems.

First, use of an electron beam causes the decrease of productivity.

Second, it takes a long time to write over the entire wafer.

Third, a thickness of a photoresist layer is too thick to reduce a pattern width.

Fourth, since a photoresist used for an electron beam has a poor heat-resistance, it is difficult to form a gate metal.

SUMMARY OF THE INVENTION

Therefore, the present invention is directed to a method for manufacturing a MESFET that substantially obviates one or more of problems due to limitations and disadvantages of the related art.

An object of the invention is to provide a method for manufacturing a MESFET having an excellent reproductivity by employing photolithography twice.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for manufacturing a MESFET includes the steps of: forming a n-type GaAs layer and a heavily doped n$^+$-type GaAs layer on a substrate, sequentially; forming a first insulating layer on the heavily doped n$^+$-type GaAs layer; forming a first photoresist layer having a first aperture on the first insulating layer; removing the first insulating layer of the first aperture so that the first insulating layer below both ends of the first photoresist layer is under-cut; forming a second insulating layer on the substrate in the first aperture to form a second apertures at each of under-cut portions and simultaneously removing the first photoresist layer; forming a third aperture in each of the second apertures and forming a second photoresist layer on the first and second insulating layers; removing the heavily doped n$^+$-type GaAs layer in each of the second apertures to expose the n-type GaAs layer; and forming a gate electrode in the second and third apertures to contact the n-type GaAs layer and simultaneously removing the second photoresist layer.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present Invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Referring FIGS. 2a through 2g, there is illustrated a manufacturing process of a MESFET.

The method according to the first embodiment of the invention employs the use of photolithography twice. In the method, a periphery portion of a pattern which has been formed in the process of forming a first photoresist layer is used.

Figure 1A:
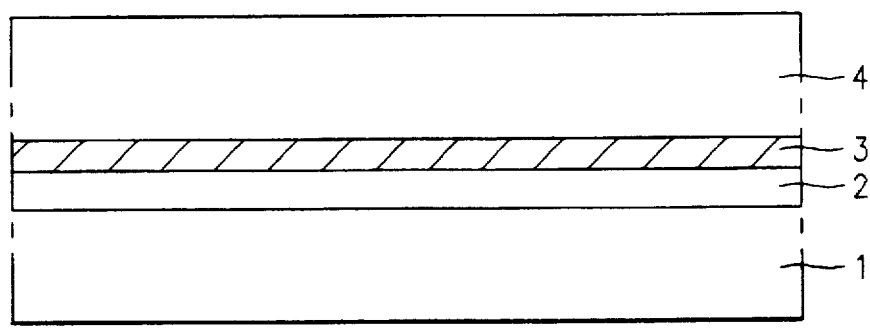
FIGS. 1a through 1 d are cross-sectional views showing process steps of a conventional method for manufacturing a MESFET.
Figure 1B:
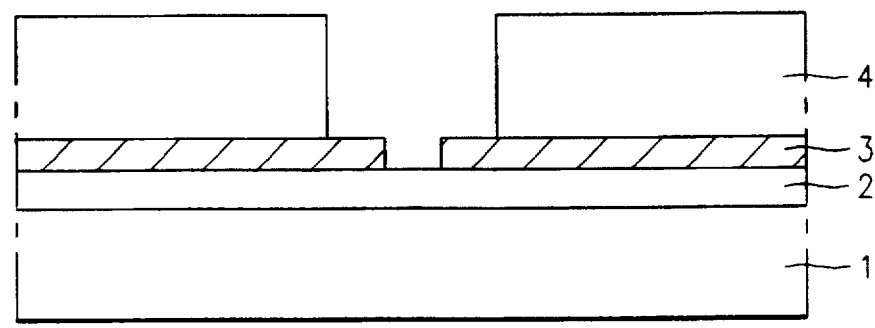
Figure 1C:
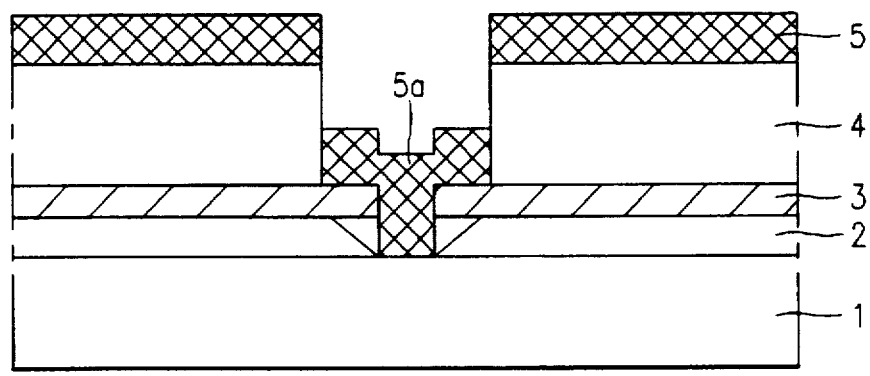
Figure 1D:
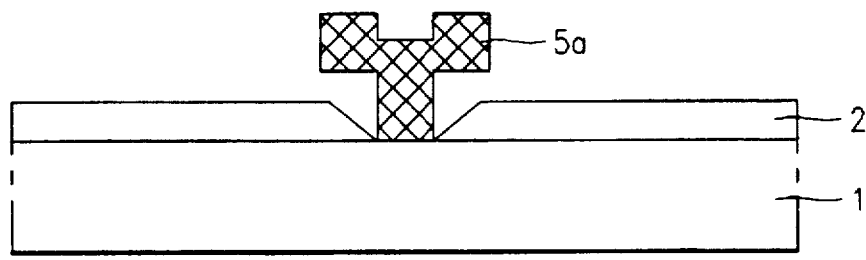
Figure 2A:
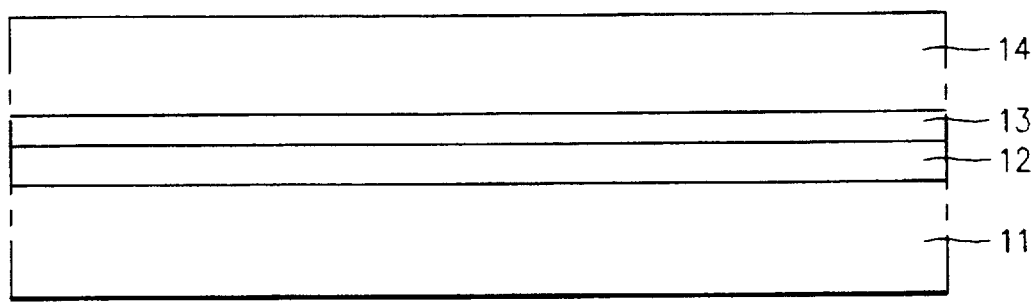
FIGS. 2a through 2g are cross-sectional views showing process steps of a method for manufacturing a MESFET according to a first embodiment of the invention.

Referring to FIG. 2a, an n-type GaAs 11 and a heavily doped $n^+$-type GaAs 12 are sequentially and epitaxially grown on a semi insulative substrate (not shown). Next, a first insulating layer 13 (which is either a nitride layer or an oxide layer) is deposited on the $n^+$-type GaAs 12 by employing a plasma enhanced chemical vapor deposition (PECVD) process or a vacuum evaporation process. Then, a first photoresist layer 14 is coated on the first insulating layer 13.

Figure 2B:
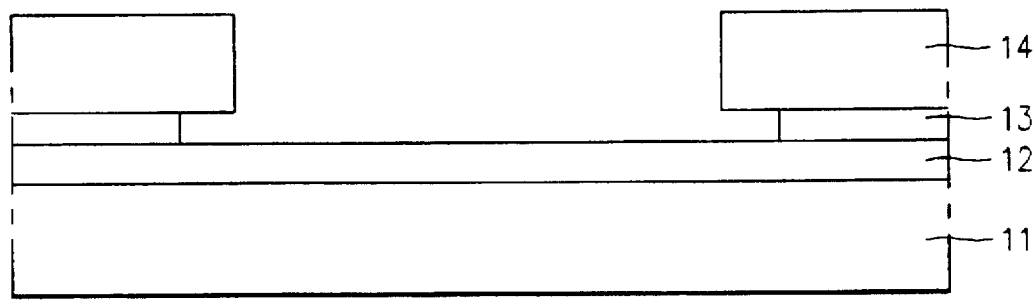

Referring to FIG. 2b, the photoresist layer 14 is patterned by a photolithography process. At this time, the removed photoresist layer 14 is a distance between gate electrodes which will be formed. When a plurality of gate electrodes are simultaneously formed, the width of the first photoresist layer 14 needs to be adjusted to be optimized. With the remaining first photoresist layer 14 serving as a mask, the first insulating layer 13 is etched with either a reactive ion etching (RIE) process or a plasma etching process. At this time, the first insulating layer 13 below the first photorestst layer 14 is under-cut by as much as a length of a gate electrode.

Figure 2C:
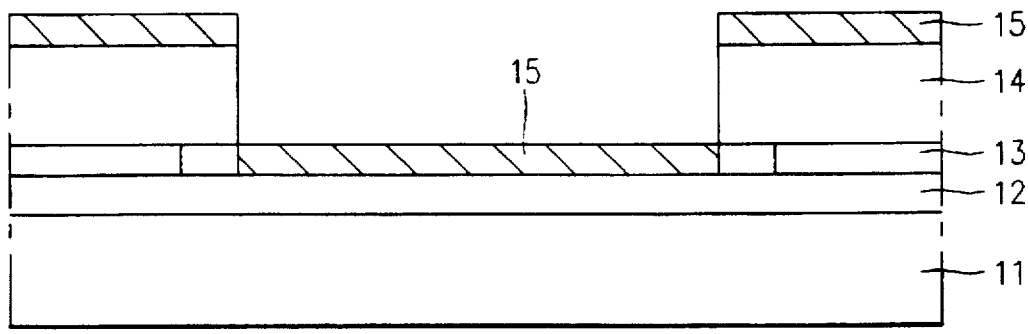

Subsequently, as shown in FIG. 2c, a second insulating flayer 15 (which is either a nitride layer or an oxide layer) is deposited on the entire surface by employing an electron beam vacuum evaporation method. At this time, since the second insulating layer 15 is formed to be directional, the second insulating layer 15 isn't formed at the under-cut portion under the first photoresist layer 14, and apertures as wide as a gate electrode are formed.

Figure 2D:
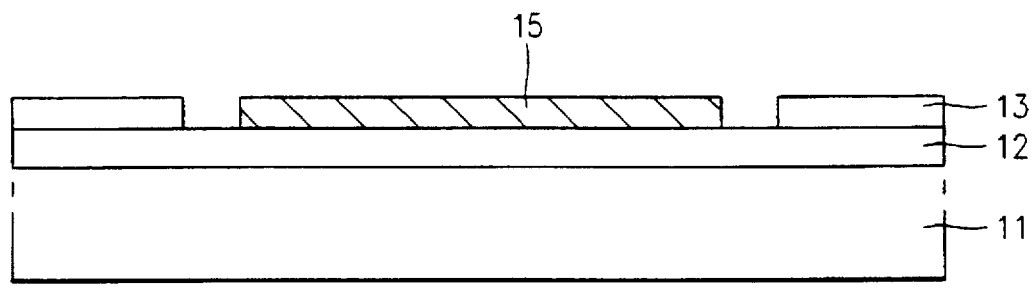

Referring to FIG. 2d, the first photoresist layer 14 and only the second insulating layer 15 on the first photoresist layer 14 are removed. At this time, the number of the gate electrodes depends on that of the apertures.

Figure 2E:
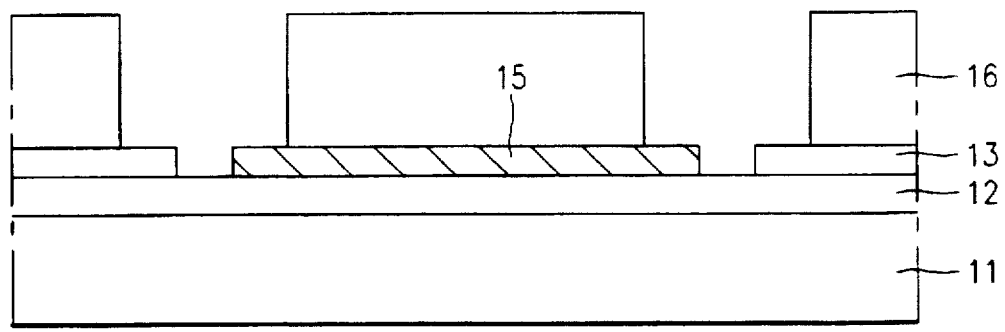

Referring to FIG. 2e, a second photoresist layer 16 is coated on the entire surface and then exposed to an electron beam so that the second photoresist layer 16 under which the apertures have been formed is removed. In this case, the removed second photoresist layer 16 is removed by a wider width than that of the apertures. The apertures' width, which a gate resistance depends on, can simply be adjusted by a photolithography process.

Figure 2F:
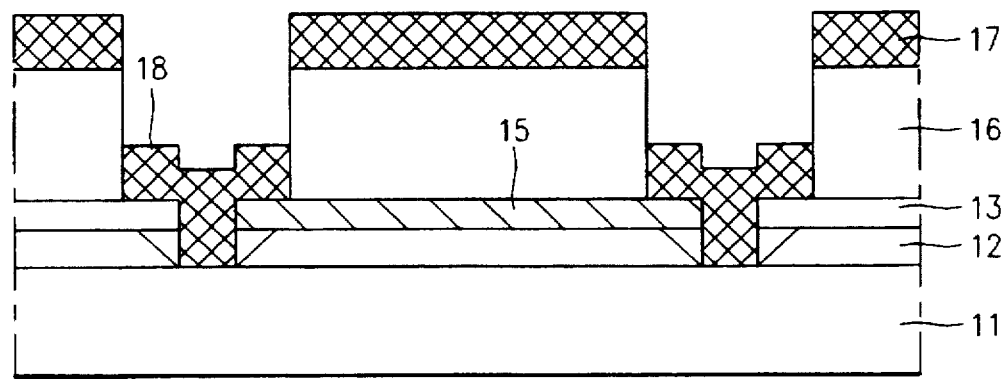

Referring to FIG. 2f, the exposed portions of the $n^+$-type GaAs layer 12 is wet-etched with the first and second insulating layers 13 and 15 serving as masks. That is to say, the $n^+$-type GaAs layer 12 below the first and second insulating layers 13 and 15 are under-cut. Then, a gate metal layer 17 is formed on the entire surface to contact the n-type GaAs layer 11.

Figure 2G:
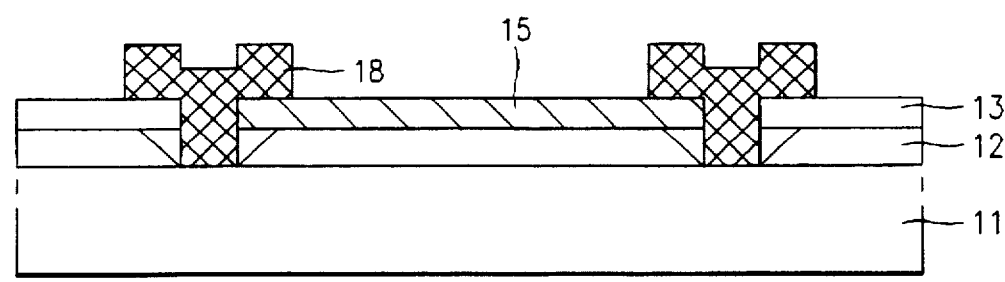

Referring to FIG. 2g, the second photoresist layer 16 and the gate metal layer 17 thereon are removed with a lift-off method, thereby forming a T-type gate electrode of a MESFET according to the first embodiment of the invention.

FIGS. 3a through 3g are cross-sectional views showing process steps of a manufacturing method of a MESFET according to the second embodiment of the invention.

Figure 3A:
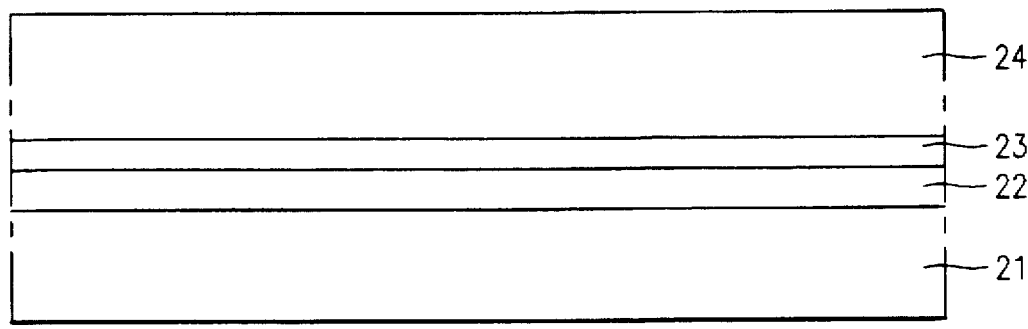
FIGS. 3a through 3g are cross-sectional views showing process steps of a method for manufacturing a MESFET according to a second embodiment of the invention.

Referring initially to FIG. 3a, on a semi insulative substrate (not shown), there are epitaxially, successively grown an n-type GaAs layer 21 and a heavily doped $n^+$-type GaAs layer 22 on which a first insulating layer 23 (which is either a nitride layer or an oxide layer) is formed by employing a PECVD process or a vacuum evaporation process. Subsequently, a first photoresist layer 24 is formed to have an aperture of a predetermined width.

Figure 3B:
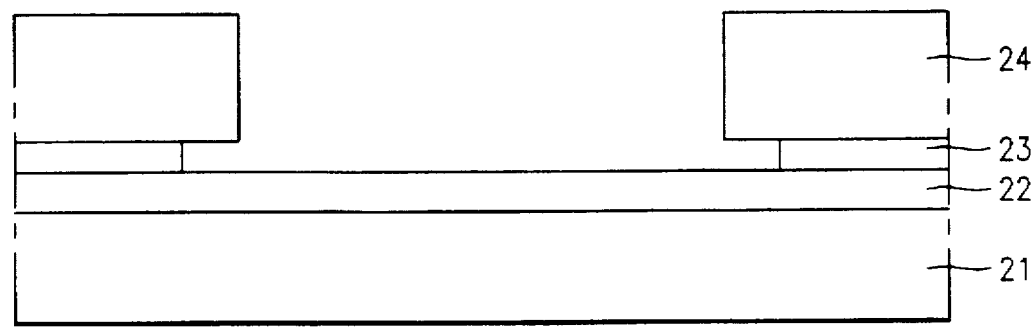

Referring to FIG. 3b, with the photoresist pattern 24 serving as a mask, the exposed portion of the first insulating layer 23 is etched with an RIE or a plasma etching. At this time, the first insulating layer 23 below the first photoresist layer 24 is under-cut.

Figure 3C:
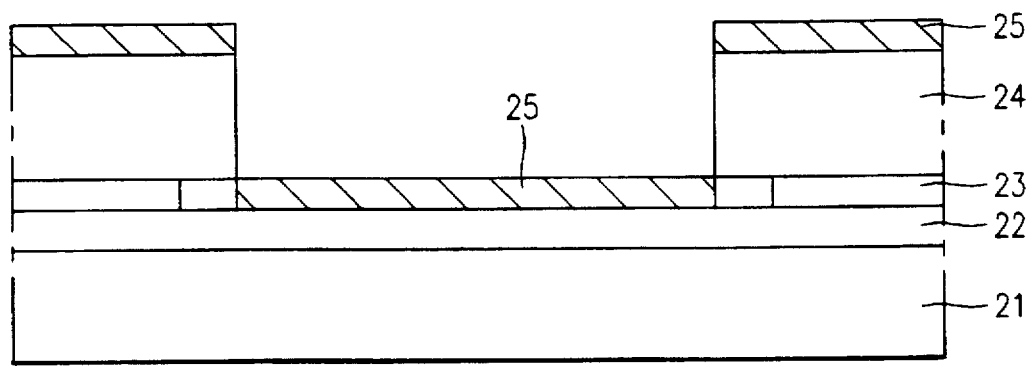

Referring to FIG. 3c, by employing an electron beam vacuum deposition process, a second insulating layer (which is either a nitride layer or an oxide layer) is deposited to be directional. Thus, the second insulating layer 25 is not formed at the under-cut portions under the first photoresist pattern 24, but apertures as wide as a gate electrode are formed there.

Figure 3D:
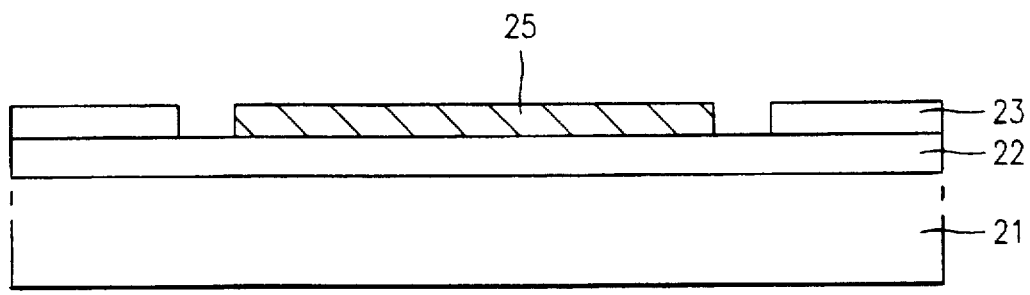

Referring to FIG. 3d, the first photoresist layer 24 and the second insulating layer 25 thereon are removed by employing lift-off. The number of the apertures depends on that of gate electrodes required.

Figure 3E:
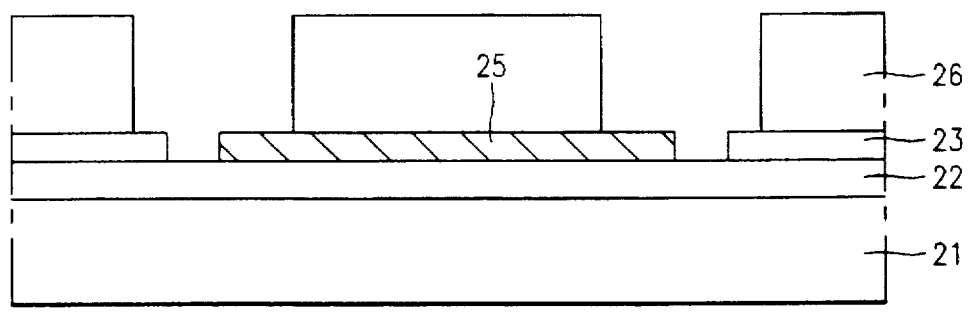

Referring to FIG. 3e, a second photoresist layer 26 is coated on the entire surface. Then the second photoresist layer 26 on the surrounding areas where the apertures have been formed is removed. In this case, the second photoresist layer 26 is removed unsymmetrically at the center of the apertures, so that a gate resistance is maintained and an overlapping area of a gate and a drain portion of a thin film transistor is small, thereby decreasing parasitic capacitance.

Figure 3F:
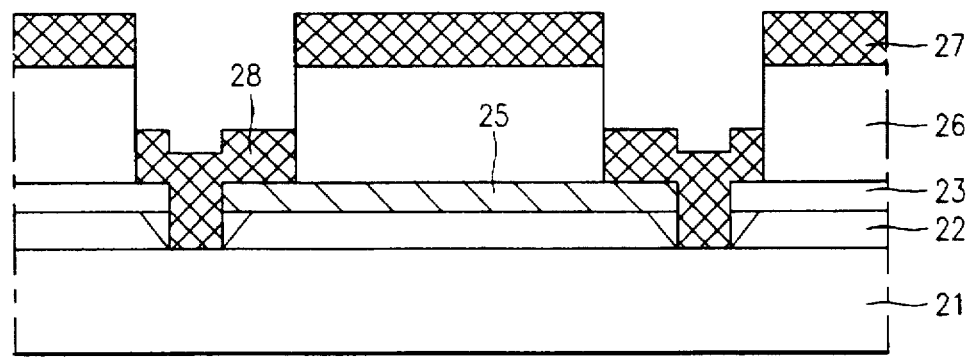

Referring to FIG. 3f, with the first and second insulating layers 23 and 25 serving as masks, the exposed portion of the $n^+$-type GaAs layer 22 is wet-etched to expose the n-type GaAs layer 21. In this case, the $n^+$-type GaAs layer 22 below the first and second insulating layers 23 and 25 is under-cut. Then, a gate metal layer 27 is formed on the entire surface to contact the n-type GaAs layer 21.

Figure 3G:
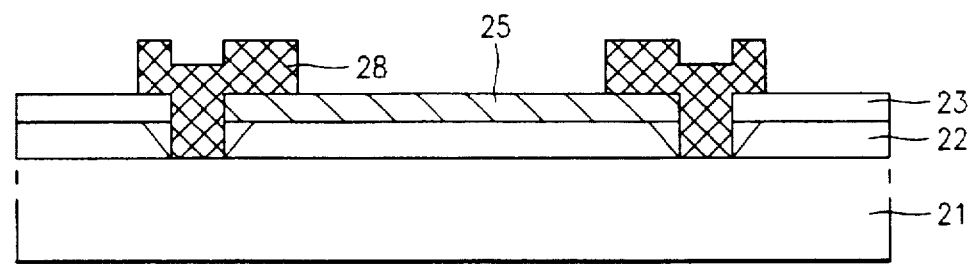

Referring to FIG. 3g, the second photoresist layer and the gate metal layer 27 thereon are removed by life-off.

The method of the invention employs photolithography so that productivity is improved and the overall manufacturing process is simplified and an excellent reproducibility can be achieved due to plasma etching.

It will be apparent to those skilled in the art that various modifications and variations can be made in the method for manufacturing a MESFET of the present invention without departing from the spirit or scope of the inventions. Thus, it is intended that the present invention cover the modifications and variations of this invention provided they come within the scope of the appended claims and their equivalents.

What is claimed is:

1. A method for manufacturing a MESFET, comprising the steps of:

(1) forming an n-type GaAs layer and a heavily doped $n^+$-type GaAs layer on a substrate, sequentially;

(2) forming a first insulating layer on the heavily doped $n^+$-type GaAs layer;

(3) forming a first photoresist layer having a first aperture on the first insulating layer;

(4) removing the first insulating layer of the first aperture so that the first insulating layer below both ends of the first photoresist layer is under-cut;

(5) forming a second insulating layer on the substrate in the first aperture to form a second aperture at each of under-cut portions and simultaneously removing the first photoresist layer;

(6) forming a third aperture in each of the second apertures and forming a second photoresist layer on the first and second insulating layers;

(7) removing the heavily doped $n^+$-type GaAs layer in each of the second apertures to expose the n-type GaAs layer; and, (8) forming a gate electrode in the second and third apertures to contact the n-type GaAs layer and simultaneously removing the second photoresist layer.

2. The method as claimed in claim 1, wherein a width of said third aperture is wider than that of the second aperture.

3. The method as claimed in claim 1, wherein, in the (4) step, the first insulating layer is removed by a plasma etching method or an RIE method.

4. The method as claimed in claim 1, wherein the first aperture is a distance between a gate electrode and another gate electrode.

5. The method as claimed in claim 1, wherein the (5) step includes the steps of forming the second insulating layer on the entire surface inclusive of the first photoresist layer and removing the first photoresist layer and the second insulating layer on the first photoresist layer.

6. The method as claimed in claim 1, wherein said third aperture is symmetrically formed at center of the second aperture.

7. The method as claimed in claim 1, wherein said third aperture is unsymmetrically formed at center of the second aperture.

8. The method as claimed in claim 1, whereon, in the (7) step, the heavily doped $n^+$-type GaAs layer is removed by wet-etch.

9. The method as claimed in claim 8, wherein the heavily doped $n^+$-type GaAs layer below the first and second insulating layers is under-cut.

10. The method as claimed in claim 1, wherein the (8) step includes the steps of forming a metal layer on the entire surface inclusive of the second photoresist layer, and removing the second photoresist layer and the metal layer on the second photoresist layer.

11. The method as claimed in claim 1, wherein said gate electrode is of T-type.

12. The method as claimed in claim 1, wherein said first and second insulating layers are made of either a nitride or an oxide.

* * * * *